United States Patent [19]
Reddy et al.

[11] Patent Number: 5,377,146
[45] Date of Patent: Dec. 27, 1994

[54] HIERARCHICAL REDUNDANCY SCHEME FOR HIGH DENSITY MONOLITHIC MEMORIES

[75] Inventors: Chitranjan N. Reddy, Milpitas; Ajit K. Medhekar, San Jose, both of Calif.

[73] Assignee: Alliance Semiconductor Corporation, San Jose, Calif.

[21] Appl. No.: 96,732

[22] Filed: Jul. 23, 1993

[51] Int. Cl.$^5$ .................. G11C 7/00; G11C 29/00
[52] U.S. Cl. ............................. 365/200; 365/201
[58] Field of Search ............ 365/200, 201; 371/10.2

[56] References Cited

U.S. PATENT DOCUMENTS

| | | | |
|---|---|---|---|
| 4,389,715 | 6/1983 | Eaton, Jr. et al. | 365/200 |
| 4,757,474 | 7/1988 | Fukushi et al. | 371/10.2 |
| 4,860,260 | 8/1989 | Saito et al. | 365/201 |
| 4,881,200 | 11/1989 | Urai | 365/200 X |
| 5,206,831 | 4/1993 | Wakamatsu | 365/200 |

Primary Examiner—Eugene R. LaRoche
Assistant Examiner—Son Dinh
Attorney, Agent, or Firm—Limbach & Limbach

[57] ABSTRACT

Hierarchical redundancy is implemented in a monolithic memory by providing standard row and column redundancy augmented by redundant blocks, each having its own internal row and block redundancy. The efficiency of the redundant blocks is further enhanced by subdividing the redundant blocks into individually replaceable segments of rows or columns. A test and repair algorithm utilizing the hierarchical redundancy scheme is also provided.

7 Claims, 4 Drawing Sheets

HIERARCHICAL REDUNDANCY SCHEME FOR HIGH DENSITY MONOLITHIC MEMORIES

BACKGROUND OF THE INVENTION

1. Field Of the Invention

The present invention relates to high-density monolithic memories and, in particular, to the utilization of a hierarchical redundancy scheme to convert a partially functional memory chip into a fully functional chip thereby improving the overall yield of functional chips on a semiconductor wafer.

2. Discussion Of the Prior Art

As memory chip density increases, the defect density resulting from the integrated circuit fabrication process limits the functional yield. While an increasing amount of attention has been focused on controlling the fabrication process to limit defect density, as chip geometries shrink and chip size increases, it becomes increasingly difficult to control the process sufficiently to achieve a high natural functional yield.

A number of techniques, such as redundancy schemes, have been utilized to increase the functional yield of memory devices. A commonly used redundancy scheme provides spare rows and/or columns in the memory array that can be used to replace defective bits, rows or columns.

FIG. 1 shows a block diagram of a typical memory chip 10 with row and column redundancy. The memory array of chip 10 is subdivided into four quadrants Q0-Q3. "Quadrant" architecture is commonly used to enhance speed and to limit the power dissipation of memory chips. Memory cells within each quadrant are organized as n rows and m columns. A selected cell in the array is accessed by simultaneously applying a row address $x_n$ to the row decoders 12 and a column address $y_m$ to the column decoders 14 utilizing the address bus 15, thereby selecting a single row and a single column in the array. The intersection of the selected row and the selected column identifies the selected cell $X_nY_m$. The data stored in that cell appears on the bit lines and is transferred to a sense amplifier (not shown) and then onto a data bus 16.

Writing to a selected memory cell is accomplished in a similar fashion, i.e., by first accessing the cell and then transferring the data to be written from the data bus 16 to the memory cell bit lines.

During the fabrication of a monolithic memory device, process defects can disable single or multiple cells, rows and/or columns in the array. As shown in FIG. 1, to overcome these defects, spare or redundant rows 18 and/or redundant columns 20 are provided. These spares can then be utilized to replace defective cells, rows and/or columns. If there is a defect in a given quadrant, causing a normal row 22 or a normal column 24 or a single bit to fail, then that particular row or column or bit is permanently disabled and is replaced by redundant row 18 or redundant column 20. The obvious limitation on the number of redundant rows and/or columns is the acceptable chip size and cost.

The redundancy scheme described above has several limitations. A redundant row can only replace a defective row or cells that are in the same row within the same quadrant. Similarly, a redundant column can only replace a defective column or cells that are in the same column, again within the same quadrant.

SUMMARY OF THE INVENTION

The present invention provides a scheme for minimizing the rigidity and limitations of simple row and column redundancy in a monolithic memory device by the addition of hierarchical redundant elements. The invention also provides a mechanism for testing and repairing these redundant elements prior to their application in repairing a defective chip, thereby maximizing the ratio of attempted-repair to successful-repair.

Hierarchical redundancy is implemented by providing standard row and column redundancy augmented by redundant quadrants, each redundant quadrant having its own internal row and column redundancy.

A test and repair algorithm utilizing the hierarchical redundancy scheme has the following basic flow. First, the main memory is tested. If the main memory is fully functional, then no repair is required. If there are defective bits in the main memory, then the local redundant rows and columns in the defective quadrant are tested to determine their functionality and the appropriate local rows or columns are used to affect the repair. If the local redundant rows and/or columns also have defective bits, then this is treated as a failed quadrant and quadrant replacement proceeds. If there are defective rows and/or columns in the main memory, then the procedure is repeated. If there are defective quadrants, then the redundant quadrants are tested, repairing them if necessary using their local redundant rows and/or columns. The natural or repaired redundant quadrants are then applied to replace defective quadrants within the memory.

The above flow can be modified and/or optimized based on the user's expertise and the empirical data of failure modes that may be available. The system of replacing faulty bits/rows/columns by the use of logic circuits with fusible links consists primarily of circuits elements that, when enabled via a fuse, will access the redundant element and, at the same time, disable the faulty element in the memory chip. Thus, the use of the hierarchical form of redundancy described above, which includes entire redundant blocks with their own local row/column redundancy, proves highly effective in improving the yield of very high density memory chips.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1:
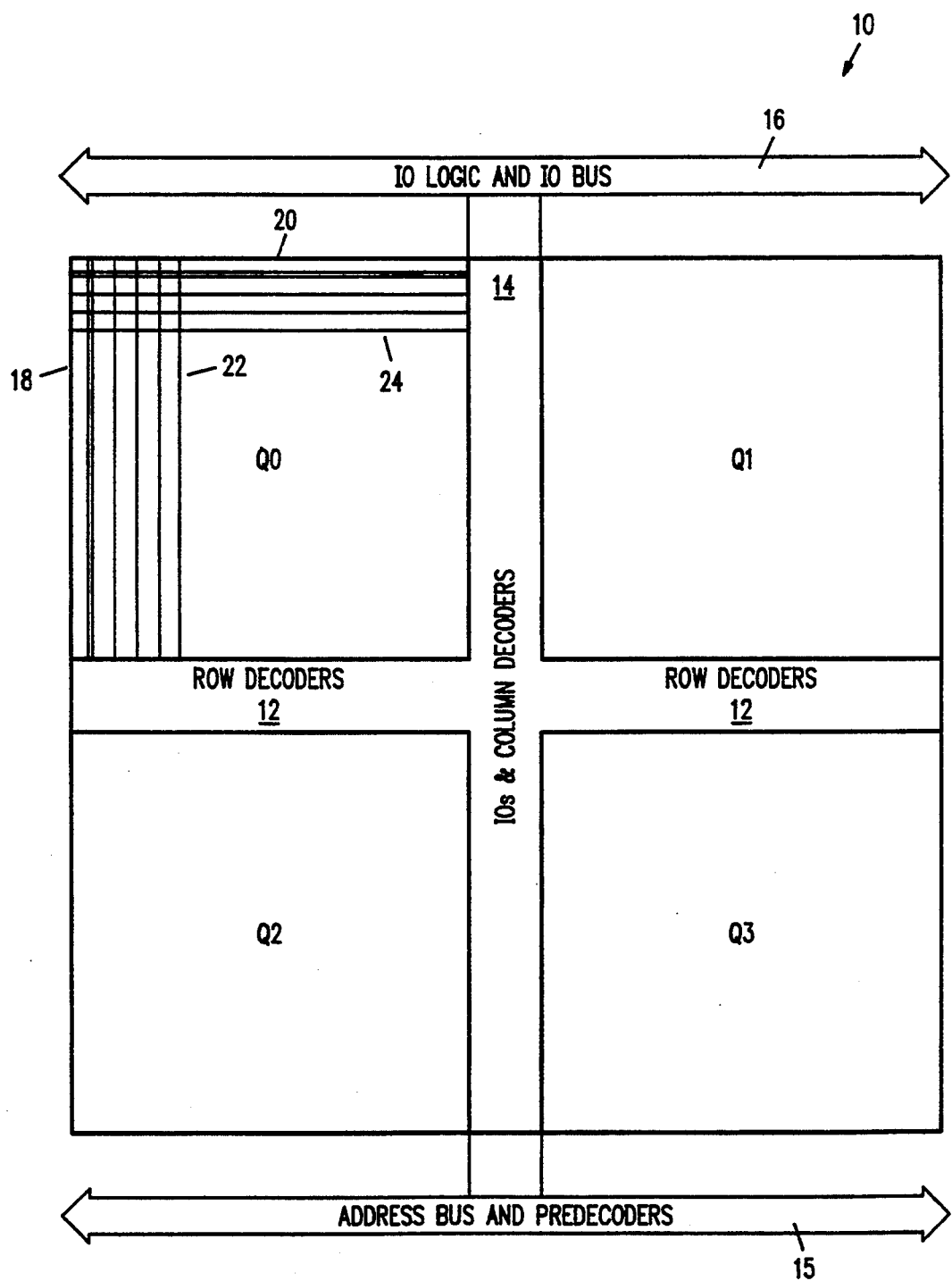
FIG. 1 is a block diagram illustrating a conventional memory device redundancy replacement scheme.
Figure 2:
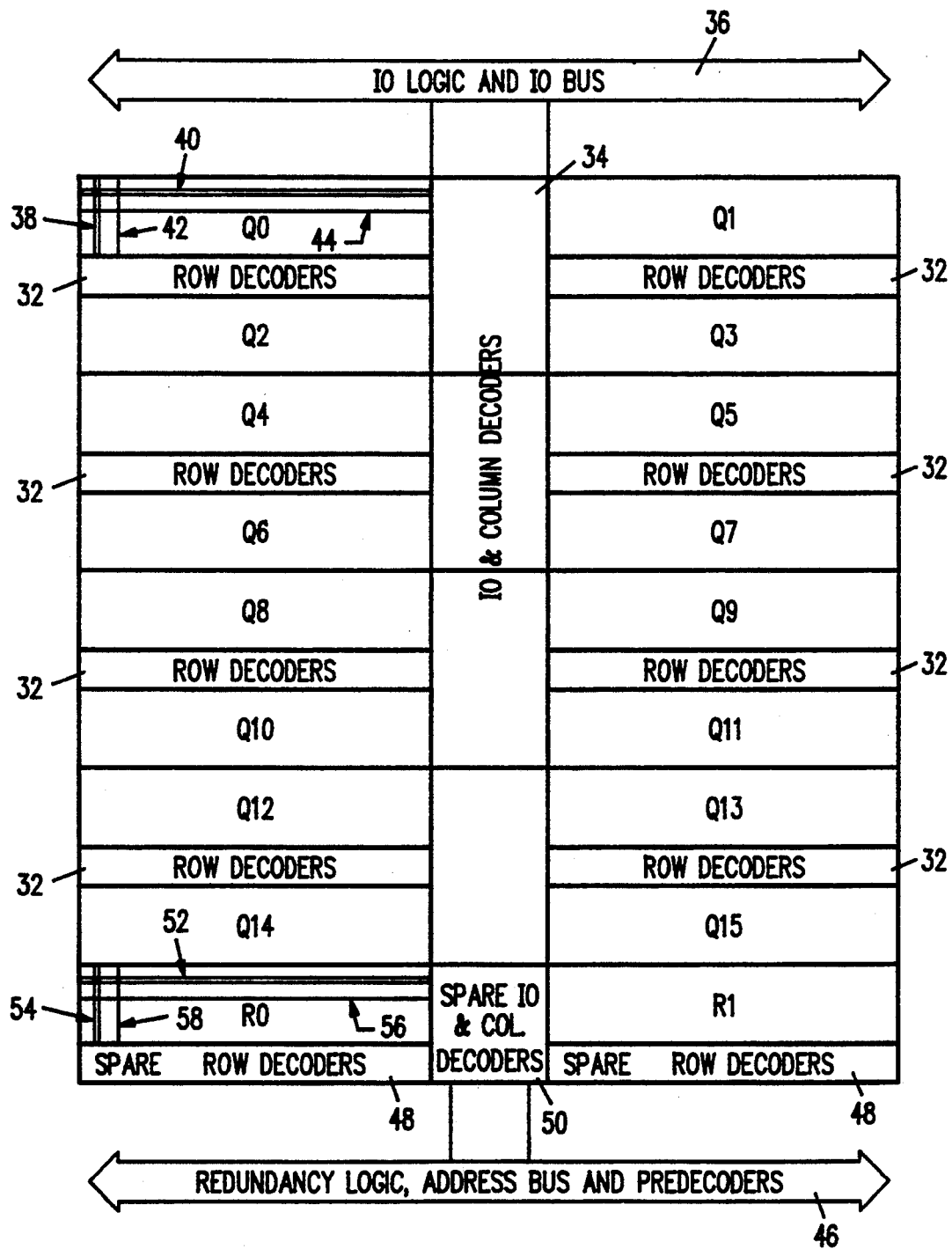
FIG. 2 is a block diagram illustrating a memory device utilizing a hierarchical redundancy scheme in accordance with the present invention.

FIG. 2 shows a block diagram of a monolithic high density memory device 30 that utilizes a hierarchical redundancy scheme in accordance with the present invention. The memory 30 is sectioned into sixteen "quadrants" Q0–Q15 to enhance speed and to limit power dissipation, a technique common to high density, high performance memories.

Row decoders 32 and column decoders 34 allow access to specific bits within each quadrant. An external address is applied via the Address Bus and Predecoders 46. The information stored in the bit accessed by the addressed row 42 and the addressed column 44 is transferred to the IO bus 36. In the illustrated embodiment, each quadrant Q0–Q15 in quadrant Q0 should each be understood to include redundant rows 38 and redundant columns 40 which can be used to replace defective elements within the quadrant.

Figure 3:
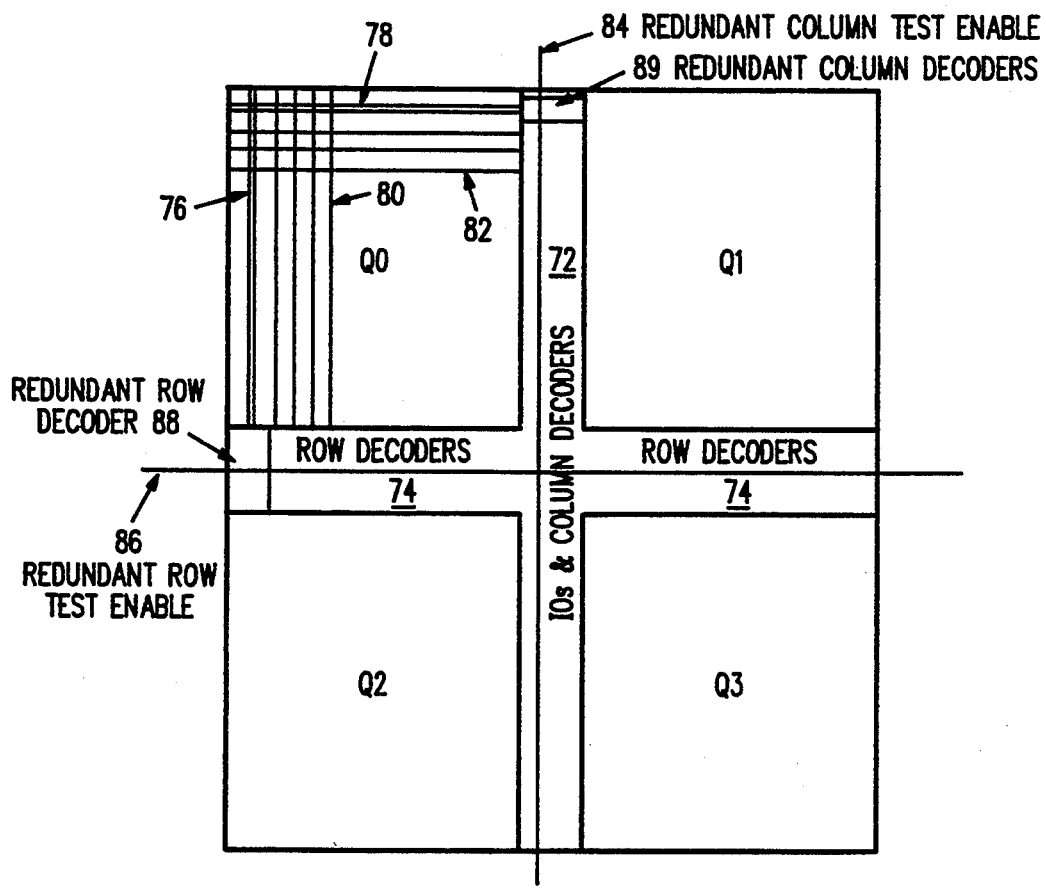
FIG. 3 is a block diagram illustrating detail of standard quadrants within a memory device that utilizes a hierarchical redundancy scheme in accordance with the present invention.

FIG. 3 shows detail of quadrants Q0–Q3 with local redundancy illustrated for quadrant Q0. That is, redundant rows 76 and redundant columns 78 are provided in quadrant Q0. Also shown are two control signals: Redundant Row Test Enable 86 and Redundant Column Test Enable 84. Further details regarding these signals are provided below.

In the event of a failure within quadrant Q0 due to a defective bit and/or a defective row and/or a failed column, the "repair" can be optimized by first determining the availability of fully functional local redundant elements. The Redundant Row Test Enable signal 86 disables all of the row decoders 74 and enables the redundant row decoders 88. The local redundant rows 76 can now be fully tested to determine functionality. Similarly, Redundant Column Test Enable signal 84 disables all of the column decoders 72 and enables the redundant column decoders to allow testing of the local redundant columns 78. Determining the extent of the functionality of the redundant rows and columns allows the user to most optimally select the replacement elements to repair defective elements within a quadrant. Furthermore, if the redundant rows and/or columns are defective, then this quadrant can be replaced by utilizing quadrant replacement.

Figure 4:
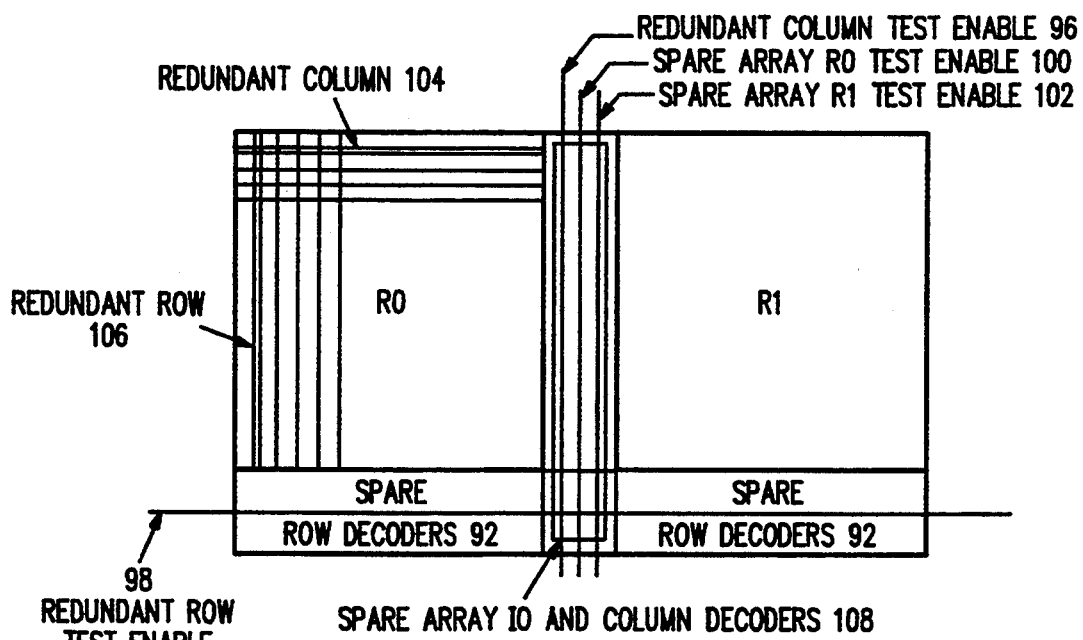
FIG. 4 is a block diagram illustrating detail of redundant quadrants within a memory device that utilizes a hierarchical redundancy scheme in accordance with the present invention.

Redundant quadrants R0 and R1 are shown in FIG. 4. If any normal quadrant Q0–Q15 is not repairable by utilizing its own local redundancy, then redundant quadrants R0 or R1 can be used to replace an entire normal quadrant. One skilled in the art will discern from the following discussion that the redundant quadrants R0, R1 can be configured as segments of rows and/or columns, thereby allowing the replacement of similar elements in normal quadrants that are not repairable by the latter's local redundancy.

As shown in FIG. 4, in accordance with the present invention, the redundant quadrants R0 and R1 contain their own local redundant rows 106 and redundant columns 104. If quadrant replacement is required to repair a defective quadrant Q0–Q15, then the procedure for such a replacement consists of first testing the redundant quadrants R0 and R1. This allows the user to utilize the redundant quadrants in the most efficient manner. The redundant quadrants R0 and R1 can be tested by asserting the Spare Array R0/R1 Test Enable signals 100/102. These signals disable the normal quadrants Q0–Q15 and enable the redundant quadrants R0 and R1. Addresses appearing on the global address bus 46 in FIG. 2 will be decoded and enable the redundant row decoder 92 and redundant column decoder 108 shown in FIG. 4. The bits accessed in the redundant quadrants R0 and R1 will pass their data to the global IO bus 36 (see FIG. 2) via the local IO bus 108 in FIG. 4. In the event that the redundant quadrants R0 and R1 have failing bits, rows and/or columns, the local redundant row 106 and/or the local redundant column 104 can first be tested by the test enable signals 96 and 98 to determine the optimal repair algorithm for the redundant quadrants R0 and R1. After determining that the redundant quadrants R0 and R1 are defect free, either naturally or after local row/column repair, these redundant quadrants can be used to affect the replacement of a defective quadrant Q0–Q15.

The efficiency of the redundant quadrant feature of the hierarchical redundancy scheme of the present invention can be further enhanced by subdividing the redundant quadrants R0, R1 into individually replaceable segments of rows or columns.

Figure 5:
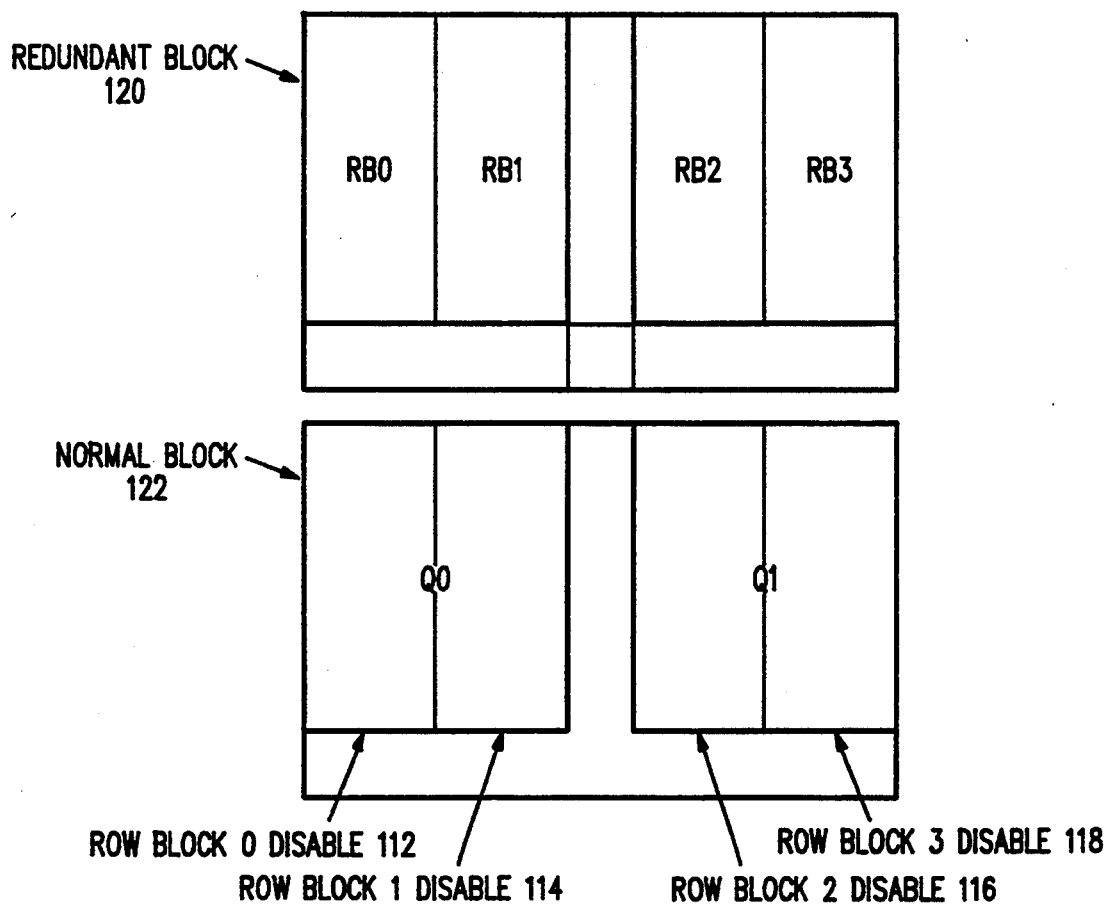
FIG. 5 is a quadrant diagram illustrating subdivision of a redundant block within a memory device that utilizes a hierarchical redundancy scheme in accordance with the present invention.

FIG. 5 shows an example of such an implementation. Redundant quadrant R0 has been subdivided into row segments RB0 and RB1; similarly, redundant quadrant R1 has been subdivided into row segments RB2 and RB3. Additional control signals 112–118 are provided in the normal quadrants Q0 and Q1. These signals are used to disable defective row segments when replacing them with redundant segments RB0–RB3 from the redundant quadrants.

The foregoing describes an implementation and utilization of a hierarchical redundancy scheme in accordance with the present invention. The implementation of basic redundancy, the process of disabling defective elements and enabling spares, is accomplished utilizing logic circuits and fusible links that are well documented in the literature. Since there are several approaches to the latter, it is intended that the following claims define the specific nature of the hierarchical redundancy scheme.

That is, it should be understood that various alternatives to the embodiment of the invention described herein may be employed in practicing the invention. It is intended that the following claims define the scope of the invention and that structures and methods within the scope of these claims and their equivalents be covered thereby.

What is claimed is:

1. A monolithic memory device having hierarchical redundancy, the monolithic memory device comprising:

a plurality of main memory quadrants, each main memory quadrant including a plurality of main memory storage cells arranged as a matrix of a plurality of rows of main memory storage cells and a plurality of columns of main memory storage cells, each main memory quadrant further including at least one redundant row of local main memory storage cells and at least one redundant column of local main memory storage cells; and at least one redundant memory quadrant that includes a plurality of redundant memory storage cells arranged as a matrix of a plurality of rows of redundant memory storage cells and a plurality of columns of redundant memory storage cells, the at least one redundant memory quadrant including at least one redundant row of local redundant memory storage cells and at least one redundant column of local redundant memory storage cells.

2. A monolithic memory device having hierarchical redundancy as in claim 1 and wherein the main memory storage cells are testable to determine whether individual main memory storage cells are defective or are not defective such that defective main memory storage cells may be replaced by local memory storage cells.

3. A monolithic memory device having hierarchical redundancy as in claim 1 and wherein the main memory storage cells are testable to determine whether individual main memory storage cells are defective or are not defective such that a row of main memory storage cells determined to include a defective main memory storage cell may be replaced by the at least one redundant row of local main memory storage cells and a column of main memory storage cells determined to include a defective main memory storage cell may be replaced by the at least one redundant column of local main memory storage cells.

4. A monolithic memory device having hierarchical redundancy as in claim 1 and wherein the main memory storage cells are testable to determine whether individual main memory cells are defective or at not defective such that a main memory quadrant determined to include a defective main memory storage cell may be replaced by the at least one redundant quadrant.

5. A monolithic memory device having hierarchical redundancy as in claim 4 and wherein the at least one redundant quadrant may be segmented into blocks of rows and/or columns of redundant memory storage cells thereby allowing replacement of blocks of rows and/or columns of main memory storage cells from the main memory quadrants.

6. A monolithic memory device having hierarchical redundancy as in claim 3 and wherein the local main memory storage cells are testable to determine whether individual local main memory storage cells are defective or are not defective such that, in the event that the at least one redundant row of local main memory storage cells is determined to include a defective local main memory storage cell, the row of main memory storage cells determined to include a defective main memory storage cell may be replaced by a row of redundant memory storage cells in the at least one redundant memory quadrant and such that, in the event that the at least one redundant column of local main memory storage cells is determined to include a defective local main memory storage cell, the column of main memory storage cells determined to include a defective main memory storage cell may be replaced by a column of redundant memory storage cells in the at least one redundant memory quadrant.

7. A monolithic memory device having hierarchical redundancy as in claim 6 and wherein the redundant memory storage cells in the at least one redundant memory quadrant are testable to determine whether individual redundant memory storage cells in the at least one redundant memory quadrant are defective or are not defective such that, in the event that the row of redundant memory storage cells is determined to include a defective redundant memory storage cell, the row of main memory storage cells determined to include a defective main memory storage cell may be replaced by the at least one redundant row of local redundant memory storage cells in the at least one redundant memory quadrant and such that, in the event that the column of redundant memory storage cells is determined to include a defective redundant memory storage cell, the column of main memory storage cells determined to include a defective main memory storage cell may be replaced by the at least one redundant column of local redundant memory storage cells in the at least one redundant memory quadrant.

* * * * *